(12) United States Patent
Delrosso

(10) Patent No.: US 8,439,251 B2
(45) Date of Patent: *May 14, 2013

(54) WIRING METHOD AND DEVICE

(75) Inventor: Giovanni Delrosso, Milan (IT)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/324,117

(22) Filed: Dec. 13, 2011

(65) Prior Publication Data

US 2012/0118938 A1    May 17, 2012

Related U.S. Application Data

(63) Continuation of application No. 11/793,290, filed as application No. PCT/EP2004/014802 on Dec. 29, 2004, now Pat. No. 8,096,463.

(51) Int. Cl.
*B23K 1/00* (2006.01)
*B23K 35/00* (2006.01)
*B23K 31/02* (2006.01)

(52) U.S. Cl.
USPC ..... 228/175; 228/121; 228/124.5; 228/123.1; 228/120; 228/44.7; 361/271

(58) Field of Classification Search ........... 228/175, 228/44.7, 124.5, 123.1, 120; 361/272, 271
See application file for complete search history.

(56) References Cited

U.S. PATENT DOCUMENTS

| | | | | |
|---|---|---|---|---|
| 3,130,757 A | * | 4/1964 | Schellack | 140/71.5 |
| 3,145,448 A | * | 8/1964 | Cotton | 29/25.42 |
| 5,918,362 A | * | 7/1999 | Yamashita et al. | 29/743 |
| 2003/0015572 A1 | * | 1/2003 | Faska et al. | 228/175 |

FOREIGN PATENT DOCUMENTS

| | | | |
|---|---|---|---|
| JP | 02249201 A | * | 10/1990 |
| JP | 10241904 A | * | 9/1998 |
| JP | 2000061689 A | * | 2/2000 |

OTHER PUBLICATIONS

English Computer Translation of JP 2000061689 A.*
English Computer Translation of JP 10241904 A.*
English Computer Translation of JP 02249201 A.*

* cited by examiner

*Primary Examiner* — Erin Saad
(74) *Attorney, Agent, or Firm* — Honigman Miller Schwartz and Cohn LLP

(57) ABSTRACT

To permanently apply lead terminals to corresponding electrodes of electronic or electro-optic components, a. providing a frame including a tensioned wire, b. providing a holding jig including at least one seat in which the components can be removably and temporarily retained, c. applying the components to the seats with the respective electrodes aligned along a respective longitudinal direction, d. applying the holding jig to the frame and orienting the same so that the longitudinal direction corresponds to the direction of the tensioned wire, the tensioned wire being thereby brought substantially in contact with (all) the electrode(s) aligned to each other on a corresponding row of components, e. electrically and mechanically bonding the tensioned wire to the corresponding electrodes, and f. cutting the wire to separate the components from each other thereby forming a respective lead terminal for each electrode.

22 Claims, 12 Drawing Sheets

WIRING METHOD AND DEVICE

CROSS REFERENCE TO RELATED APPLICATIONS

This application is a continuation of U.S. patent application Ser. No. 11/793,290 filed Aug. 14, 2008, U.S. Pat. No. 8,096,463, which is a national stage application based on PCT/EP2004/014802 filed Dec. 29, 2004, the content of which is incorporated herein by reference.

TECHNICAL FIELD

The present invention relates to a wiring method for permanently applying lead terminals to corresponding electrodes of electronic or electro-optic bipolar components. The invention also relates to a wiring device operating according to said method.

TECHNOLOGICAL BACKGROUND

Components adapted to be treated with the method and device of this invention include, by way of non limiting example, liquid crystal (LC) cells, including polymer dispersed liquid crystals, condensers, resistors, inductors, particularly of the surface mounting type, thin or thick film hybrid circuits and the like.

Traditionally, terminals suitable to be applied to such components are shaped as electro-conductive wires, strips or lead frames and are welded (brazed) or glued, using electro-conductive glues, onto respective contact electrodes. Also known are spring type lead frames such as those manufactured by Die-Tec, Inc., 295 Sipe Road—York Haven, Pa. 17370, which are mechanically locked to the electrodes.

The term "wire" in the following context will be used to define an elongated electrically conductive element having any suitable shape to form a lead terminal, including any elongated cylindrical or strip- or band-like shape suitable for this purpose, traditional wires, or lead frames.

Permanent application of "wires" in this technical field is also known as "wiring".

Presently known wiring techniques provides for the wiring of a single component at a time, by applying a layer of conductive glue or soldering paste over the electrodes, placing and holding appropriate wires in contact with the above mentioned layer and melting the soldering paste or curing the glue to obtain permanent mechanical and electric bonding of the wires to the electrodes. While these techniques allow high process automation and achievement of a reasonable wiring speed, the fact that each component is singularly wired as an individual element still remain an evident limitation to a very automated, high throughput wiring process. U.S. Pat. No. 4,682,563 describes a jig for arraying and supporting a multiplicity of articles to be soldered, such as ICs. This patent is mentioned as background art but it is not pertinent to the invention.

The technical problem at the basis of this invention is that of providing a new wiring method for electronic or electro-optic bipolar components by which either one or a plurality of components can be simultaneously wired. Within the general sphere of this problem, it is an important scope of the invention to provide a method applicable to different types of components without substantial changes.

DISCLOSURE OF THE INVENTION

Briefly, the method of the present invention, to permanently apply lead terminals to corresponding electrodes of electronic or electro-optic components, comprises the following steps:

a) providing a frame including at least one tensioned wire,
b) providing a holding jig including at least one seat in which a respective one of said components can be removably and temporarily retained,
c) applying said components to said seats with the respective electrodes aligned along a respective longitudinal direction; in this way a row of aligned components is obtained, each component having a corresponding electrode aligned to the subsequent one in the row,
d) applying said holding jig to said frame and orienting the same so that said longitudinal direction corresponds to the direction of said tensioned wire, said tensioned wire being thereby brought substantially in contact with (all) the electrode(s) aligned to each other on a corresponding row of components,
e) electrically and mechanically bonding said tensioned wire to the corresponding electrodes; in this way all components are simultaneously bonded to the wire,
f) cut said wire to separate said components from each other thereby forming a respective lead terminal for each electrode.

Although the method of the invention is directed to wiring of bipolar components it may happen that only one of the electrodes is wired. Typically, this is the case of radiative RF (Radio Frequency) or MW (microwave) devices such as transmitting and/or receiving antennas or electronic or electro-optic devices in which the electrode that needs no wiring is represented by an extended metallization on one of the two main surfaces of the device. Examples thereof are groundplane electrodes, sliding contact surfaces, or transducer parts of sensors (i.e. plates for electric charge sensors).

By this method it is possible to mechanically and electrically bond all components applied to a holding jig simultaneously to the tensioned wire or wires so that all components applied to the same jig are connected with a corresponding electrode to the same wire which is then cut to separate the components from each other but leaving a barb of wire attached to the corresponding electrode as a lead terminal thereof.

The components preferably include one or more layers superimposed to one another, having at least two electrodes which are set at a distance from each other and are substantially parallel to one another. This is the typical case of bipolar components.

In that case, a corresponding number (at least two) of tensioned wires are provided on the frame, the wires being set at the same distance from each other as the electrodes, so that, when one of said wires is substantially in contact with one of said electrodes, the other one of said wires is also substantially in contact with the other one of said electrodes.

The wording "substantially in contact" is intended to mean, in this context, that the wires are spaced apart from the surface of the electrodes, when applied thereto prior to bonding, of a distance comprised between 0 and 200 micrometers.

BRIEF DESCRIPTION OF THE DRAWINGS

Further features and advantages of the invention will appear from the following detailed description thereof given by way of example, with reference to the attached drawings wherein.

PREFERRED EMBODIMENTS OF THE INVENTION

Figure 1A:
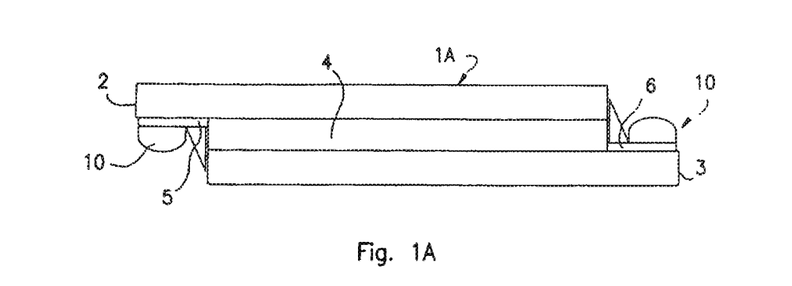
FIGS. 1A, B and C are schematic side views of three different types of components adapted to be wired with the method and device of this invention.
Figure 1B:
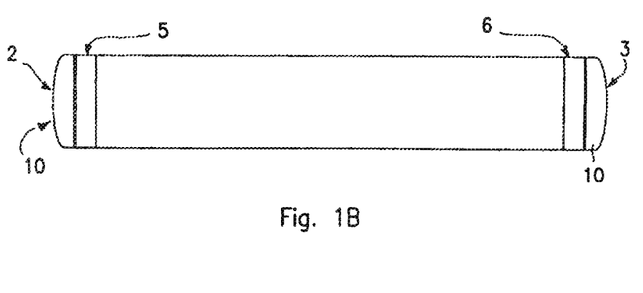
Figure 1C:
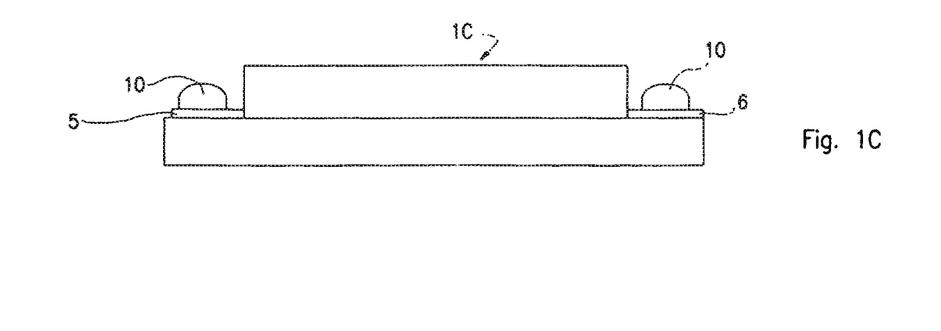

FIGS. 1A through 1C disclose typical configuration of electronic or electro-optic bipolar components suitable for the wiring method and device of this invention. Identical reference numerals indicate functionally identical parts.

FIG. 1A shows schematically a cell 1A of the liquid crystal (LC) or polymer disperse liquid crystal (PDLC) type, including two transparent electrode-bearing sides 2,3 and a spacer 4 comprised there between including a LC or a PDLC. For instance, sides 2 and 3 can each comprise a transparent electric conductor, which is capped by a supporting glass layer. Respective electrode pads 5,6 are formed on each of the sides 2,3.

An example of a cell 1A is the assembly of a tunable mirror such as the one disclosed in U.S. Pat. No. 6,215,928.

The geometry of the cell 1B of FIG. 1B is frequently used in passive electronic components (resistors, condensers and inductors) of the surface mounting type or hybrid circuits (thick or thin film). Electrode pads 5,6 are placed on two opposite longitudinal sides of the cell.

FIG. 1C discloses another possible geometry of a cell 1C provided with coplanar electrode pads 5,6.

Figure 13:
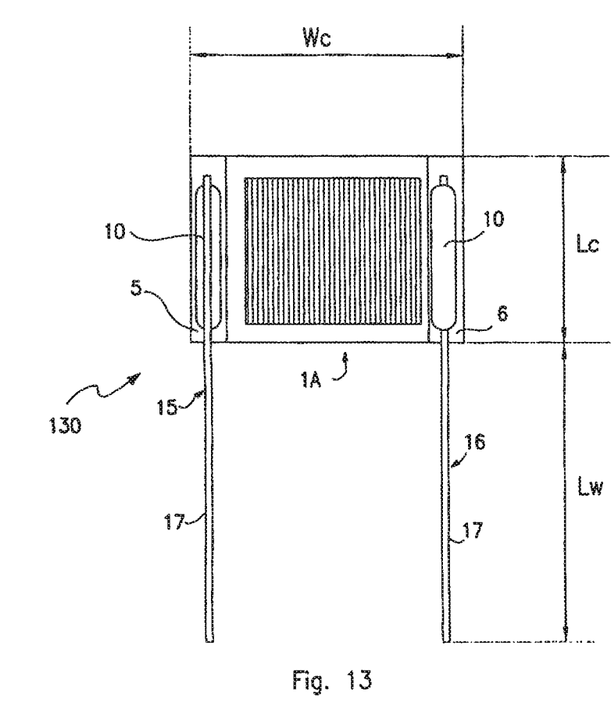
FIG. 13 is a top plan view of a wired component.

A wired cell of the 1A type is shown at FIG. 13, wherein two lead terminals 15, 16 affixed to the respective electrode surface 5,6 have lead or extensions 17. Similar structure apply to the cells of the 1B and 1C type, when wired.

Figure 14:
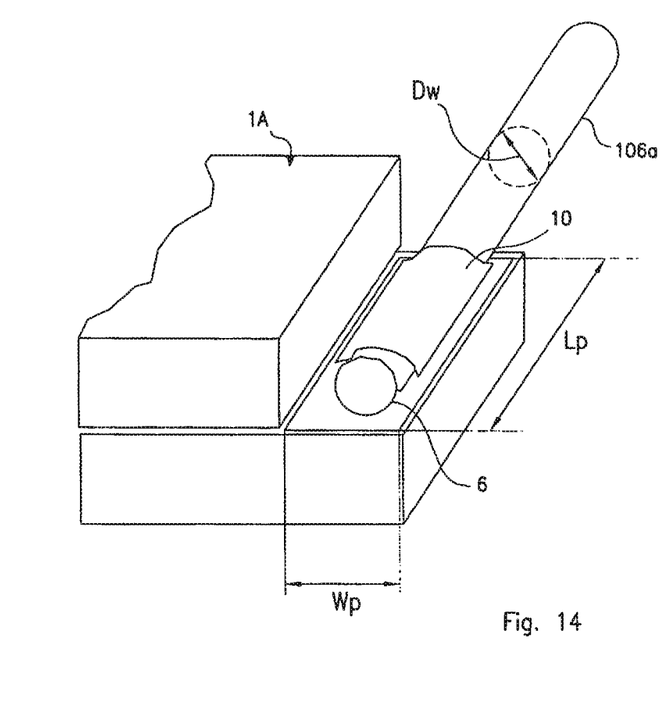
FIG. 14 is a perspective partial view of the component of FIG. 13 on an enlarged scale.

Wc and Lc respectively indicate the width and length of the cell 1A as shown in FIG. 13. Lw indicates the effective terminal wire length, while dw is its diameter, assuming that the terminal has a circular cross section (FIG. 14). Wp and Lp indicate the electrode pad width and length, respectively. Finally, reference numeral 10 indicates a layer of soldering material, i.e., soldering paste or glue, provided onto the electrode pads 5,6 to electrically and mechanically bond thereto the lead terminals 15, 16. Although generally a layer of soldering material is applied to the electrode pads, a drop or a ball of soldering material can be envisaged in the method of the invention.

Figure 2:
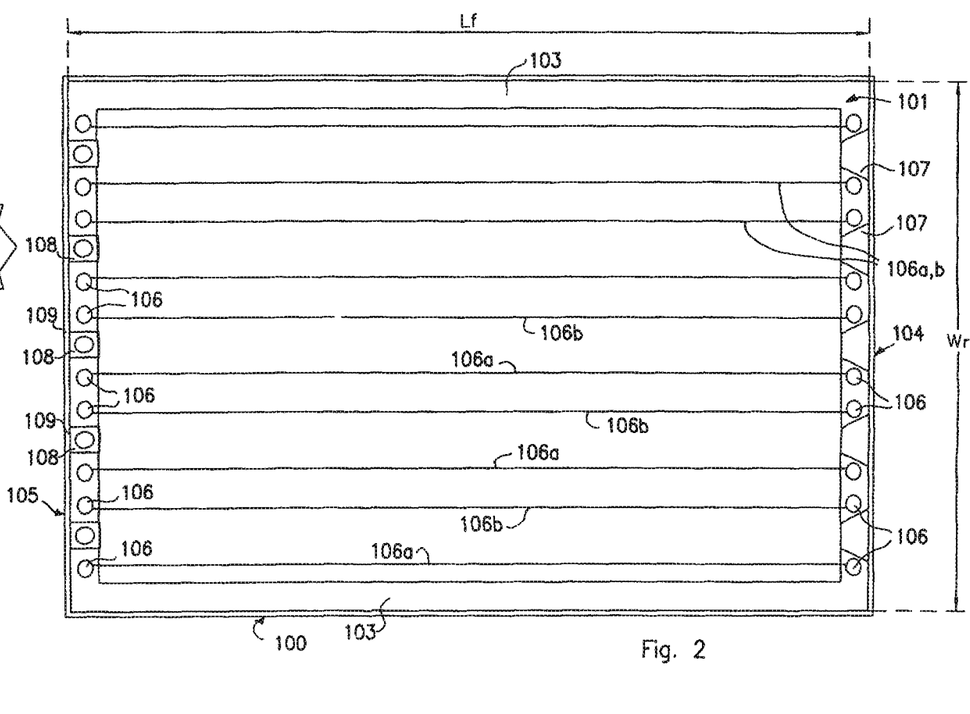
FIG. 2 is a top plan view of a first component of the device of this invention.
Figure 2A:
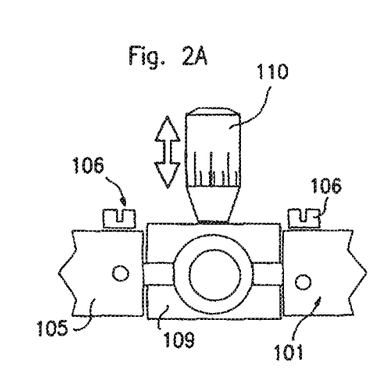
FIGS. 2A, 2B and 2C show particulars on an enlarged scale of the first component of FIG. 2.
Figure 2B:
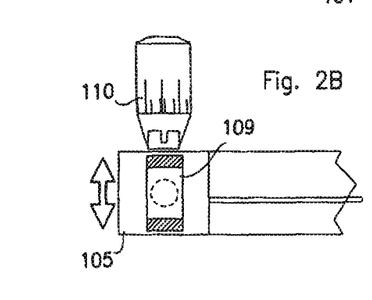
Figure 2C:
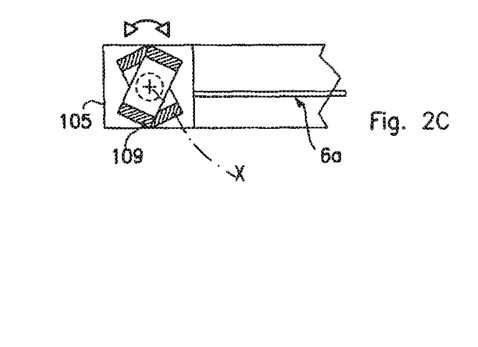
Figure 3:
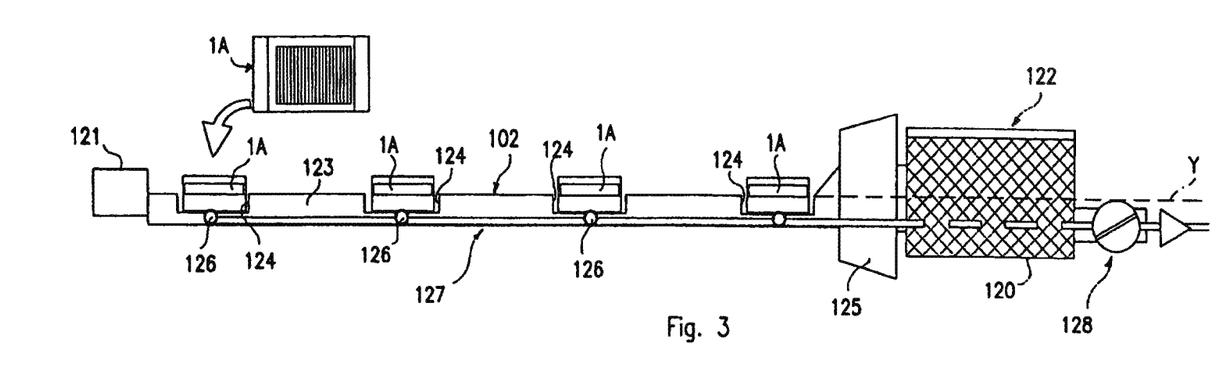
FIGS. 3 and 4 are respectively a side view and a top plan view of a second component of the device of this invention.
Figure 4:
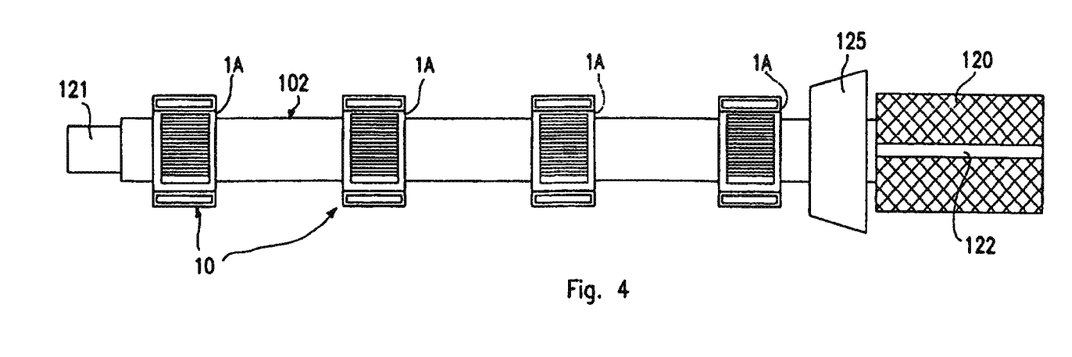

A wiring device 100 for applying the lead terminals 15,16 to the cells 1A, B, C (herein below jointly referred to as "components") according to the present invention includes a frame 101 (FIG. 2) and a plurality of holding jigs 102 (FIGS. 3 and 4).

The frame 101 (FIG. 2) has a rectangular shape with two opposite longitudinal legs both indicated by 103, determining a frame length Lf, and two opposite transverse legs 104 and 105, determining a frame width Wf.

A plurality of wire pairs 106a,b are tensioned between the transverse legs 104, 105 with respective wire ends retained by clamping screws 106. The term "tensioned wire" in the following context is intended to mean a tensioned electro-conductive element having any shape suitable to form a lead terminal, including any elongate or strip- or band-like shape suitable for this purpose.

Figure 2D:
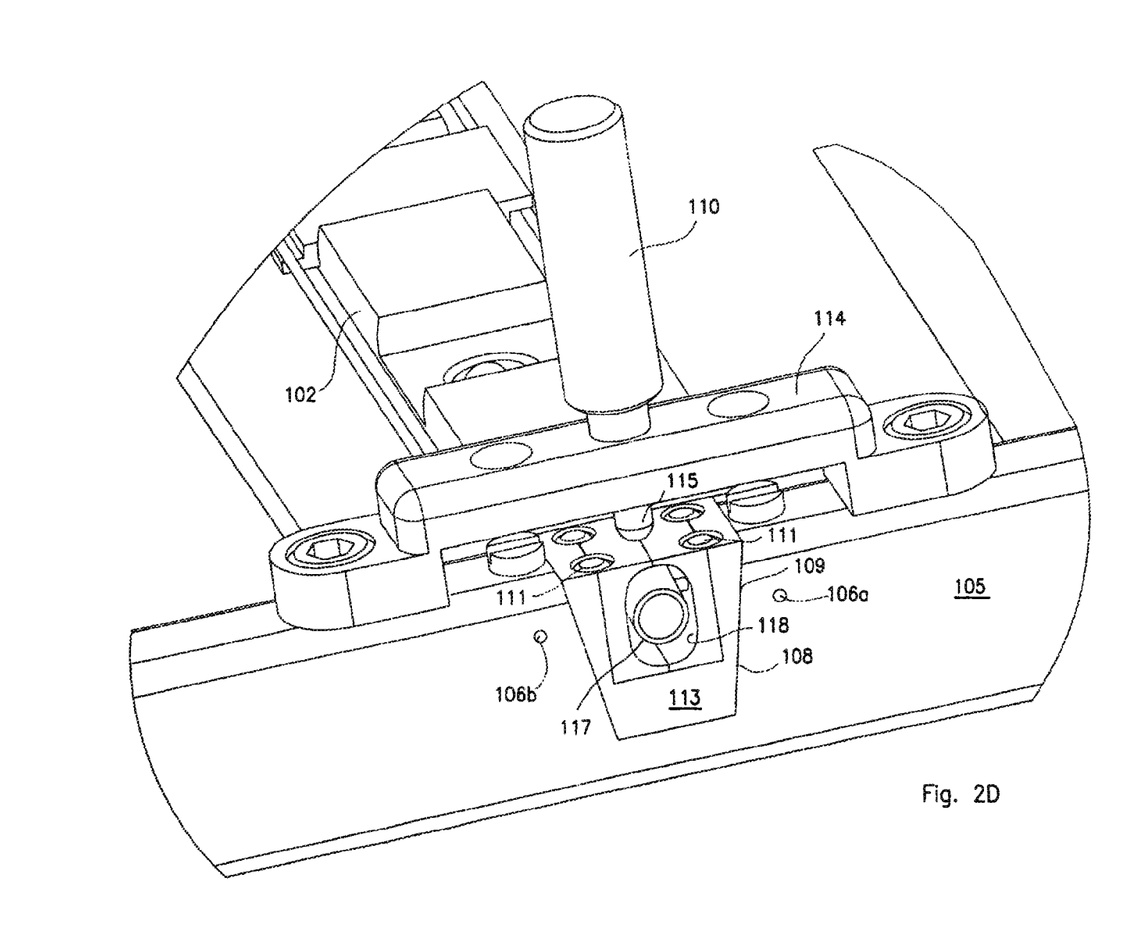
FIGS. 2D and 2E are enlarged perspective views in an assembled and exploded state respectively of the component of FIGS. 2A to 2C.
Figure 2E:
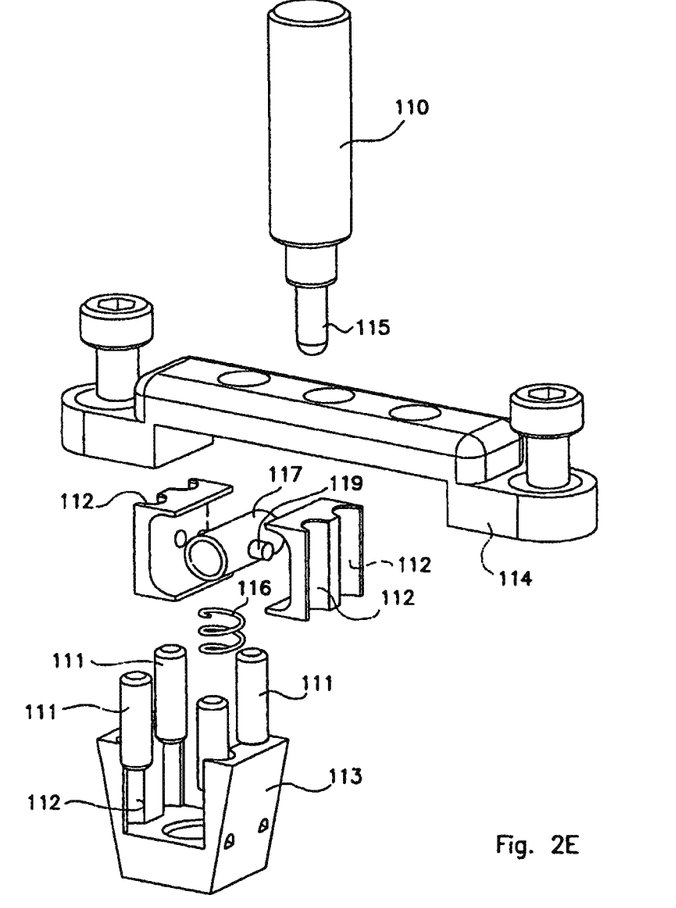

A first seat 107 is provided in leg 104 between each pair of wires 106a,b while a second seat 108 is provided in a corresponding position in leg 105. Seats 107, 108 are aligned to each other and parallel to the wires 106a,b. The seat 108 includes a sleeve 109 which is slidably guided on the leg 105 in a direction perpendicular to the leg and wires. The position of sleeve 109 is adjustable by means of a vernier group 110. Details of the seat 108, sleeve 109 and vernier group 110 are shown in FIGS. 2D and 2E in an assembled and exploded perspective view, respectively. The sleeve 109 is made by two parts both guided on guide pins 111 perpendicularly to the frame leg 105. The pins 111 are slidably nested in respective guiding grooves 112 one half of which is obtained in the sleeve outer surface and the other half in a corresponding housing provided in a centering block 113 which is fitted in the seat 108 of the frame leg. The vernier group 110 is mounted on a bridge member 114 with an adjusting pin 115 thereof urging the sleeve 109 against the bias of a spring 116. A pivoting element 117 is mounted within an aperture 118 in sleeve 109 held by pins 119 on a pivot axis.

The holding jig 102 (FIGS. 3 and 4) includes a knob 120 at one longitudinal end and a nose 121 at the opposite end, the nose 121 being rotatably received in the pivoting element 117 of sleeve 109 when the jig is mounted to the frame. The jig can be rotated on a longitudinal axis Y acting on the knob 120, a marker 122 being provided on the knob to indicate the position of the jig relatively to the frame during rotation thereof.

The jig includes a shaft 123 having a plurality of seats 124 in the form of transverse notches. The seats 124 are intended to receive each a corresponding component or cell 1A, B, or C, all components being of the same type, shape and dimensions.

An insert 125 is provided on the shaft 123 at the knob side, the insert 125 being shaped so as to self-centering fit into the first seat 107 of the frame. Each seat 124 has a bottom provided with a releasably retaining element such as a suction duct 126 connected to a suction channel 127 extending through the jig and terminating at a suction valve 128 by means of which said channel can be connected to a vacuum source such as a vacuum pump. Means other than suction can be however used to retain the components 1A, B, or C in the seats 124, such as an adhesive layer covering the bottom of seats 124 or mechanical retaining means such as clips and the like.

According to the method of this invention, the frame is first "wired" by fixing thereto a plurality of tensioned wires by means of clamping screws 106; meanwhile a soldering material is applied to the electrode pads of each cell to be wired.

It has been noted that the volume of the soldering material will depend on the dimension of the surface of the electrode pads as well as from the volume of the section of wire extending over the pad surface: preferably the soldering material shall be applied so as to cover not less than 60% of the surface of each electrode pad and the volume thereof shall be 1 to 4 times the volume of the section of wire extending over the pad surface. Higher volumes of glue used as soldering material may cause percolation and/or contamination of other surfaces.

Appropriate glues are conductive epoxies. Examples thereof are TRA-DUCT 2902 or TRA-DUCT 916H03 by TRACON inc. (45 Wiggins Avenue, Bedford, Mass. 01730—USA) or AGAR Acheson Silver DAG 1415M or similar. These glues are then baked with baking parameters spanning from 24 hours at 25° C. to 1-30 minutes at 180° C. as will be made clear hereafter with reference to the baking phase.

In case of soldering techniques, it is a first requirement that the electrode pad surface be metallurgically compatible with the wire. Examples are pads made of Cu, Ti also coated with a plurality of coatings such as Pd, Ni, Au, with wires of Cu, Fe—Ni alloys or Zn, with appropriate soldering materials such as Sn, Pb In and Ag, alloys.

An eutectic alloy known as INDIUM ALLOY #290 In97% Ag3% melting at 143° C. has been used successfully.

Due to the thermal sensitivity of liquid crystals, technological processes that include baking at relatively high temperatures are generally avoided.

The maximum temperature that a LC cell can bear without being damaged depends of course on the type of LC (or PDLC) and on the baking time.

The soldering parameters shall be preferably chosen as follows.

A preferred baking temperature range is 118 to 280° C., depending on the volume Vc and thermal mass of the cell. The higher is the thermal mass of the cell the lower shall be the baking temperature. It has been noted that for volumes Vc of 50 mm$^3$ or lower, a baking temperature of 280° C. for a baking time of 5 seconds is preferable; for Vc comprised between 50 and 250 mm$^3$ baking temperature and time shall be adjusted to 180° C. and 5 minutes respectively; for Vc comprised between 250 and 1000 mm$^3$ baking temperature and time shall be adjusted to up to 150° C. and 60 minutes, preferably.

Particular in case of LC cells, baking time is selected depending also on the baking temperature. For instance, at baking temperature of 280° C., the baking time should preferably not be higher than a few seconds, e.g., 5 s. With INDIUM ALLOY #290 In97% Ag3% melting at 143° C. as soldering material, wires size of 100 micrometers in diameter and cells having a volume of 70 mm$^3$ no derating of the cell occurred even with long baking times (ex. 120 minutes).

As far as the frame, wires and cell parameters defined above are concerned, it has been found that the following relationships preferably apply.

$$0.1Wc \leq Lc \leq 10Wc$$

$$Lc \leq Lw \leq 20Lc$$

$$0.1Wp \leq D \leq 0.8Wp$$

$$Wp \leq Lp \leq 10Wp$$

The frame shall be organised to accept a number of jigs between 1 and 100 and a corresponding number of wire pairs.

The distance (or pitch) between the wires 106a,b of each pair shall be substantially identical to the distance between the electrode pads 5, 6 of the cell. With particular reference to the component of FIG. 1A, the thickness of the cell spacer 4 shall determine the offset, if any, between the wires 106a,b of each pair.

The frame length Lf is critical for a proper tension of the tensioned wires. A satisfactory ratio between Lf and the wire diameter dw respecting the elongation characteristics of most common electro-conductive wiring materials (including Au and Ag) is given by the following empiric formula:

$$Lf/dw=1000 \text{ for } 50 \text{ μm}<dw<350 \text{ μm}$$

$$Lf/dw=1500 \text{ for } 350 \text{ μm}<dw<800 \text{ μm}$$

$$Lf/dw=1850 \text{ for } 800 \text{ μm}<dw<1000 \text{ μm}$$

Typical dimension of frames may vary from 0.001 m$^2$ to 2 m$^2$ and above with a number of cells per frame from 1 to 1000.

An important feature of this technology is that the frames may be superimposed to one another thereby obtaining a multi-layer structure which allows space saving.

Dimensional stability of the frame is also important, particularly as far as the camber of the legs under the tension of the wires is concerned. A camber of each leg of less than 1/800 on the length of the leg itself was found satisfactory, the camber being measured at the maximum temperature at which the frame can be exposed during baking of the glues or soldering paste.

Frames having an area of 0.04 m$^2$ and up to 2 m$^2$ or above are preferably made of metals, (also as a section bar) such as aluminium and its alloys, Fe—Ni alloys (es. Kovar, Invar, etc.), brass, steel, etc.

For lower area frames an economically more affordable solution could be represented by extruded or moulded plastics chosen from technical polymers having high dimensional stability such as ABS, glass-filled nylon, polycarbonates, and similar.

Once provided both frame 101 and jigs 102 and wired the frame, the jigs 102 are loaded with cells by positioning each cell in the respective seat 124 so that the electrode pads 5,6 are aligned to each other along two longitudinal directions parallel to the jig axis Y.

Either prior to loading cells into the jigs or immediately thereafter but anyway prior to inserting the jigs into the frame, the glue or soldering paste is applied to the electrodes.

The jigs are then inserted into the frame.

Figure 5:
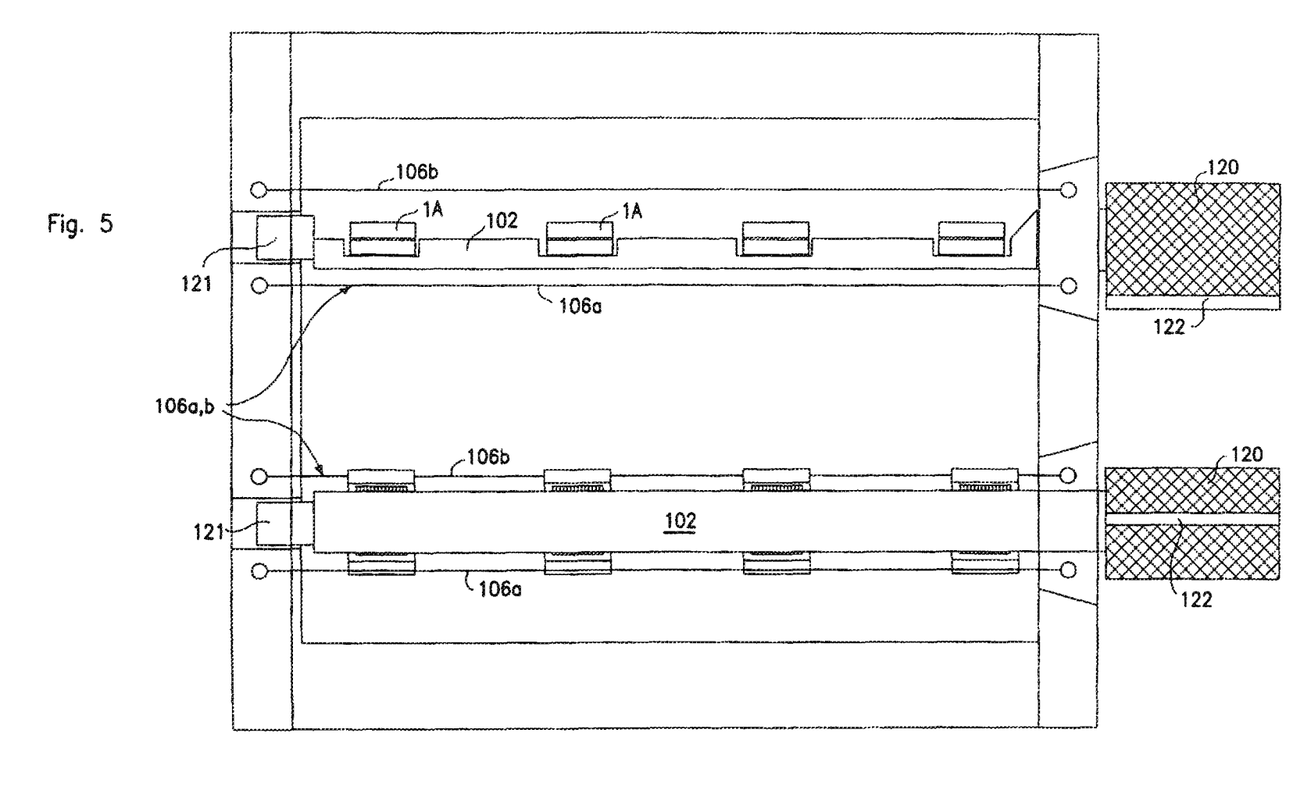
FIGS. 5 to 7 are respectively a top plan view ad two cross sectional views of the device of the preceding figures in two different phases of the method of the invention applied to the component of FIG. 1A.
Figure 6:
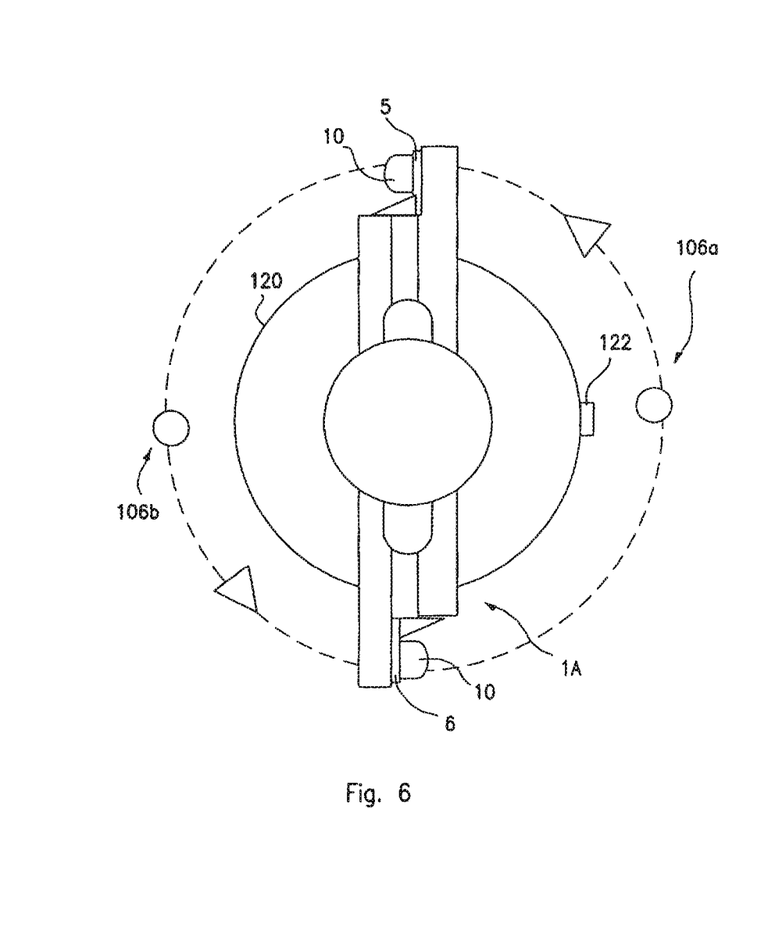
Figure 7:
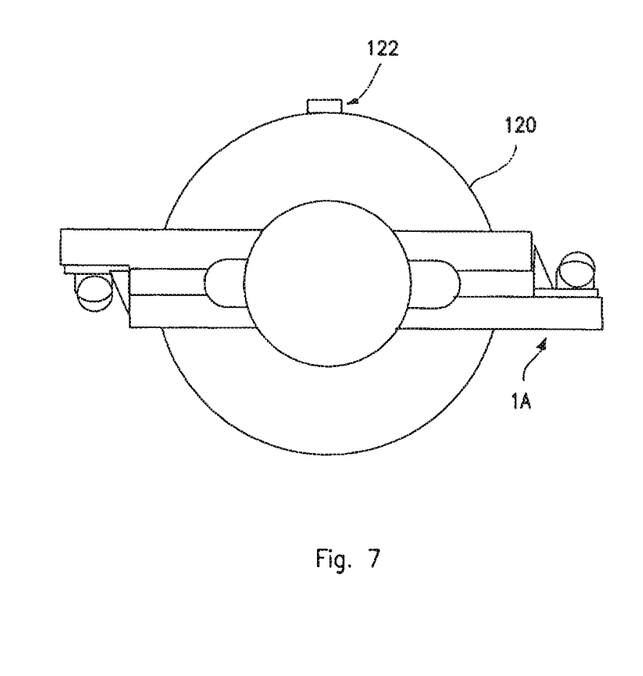
Figure 8:
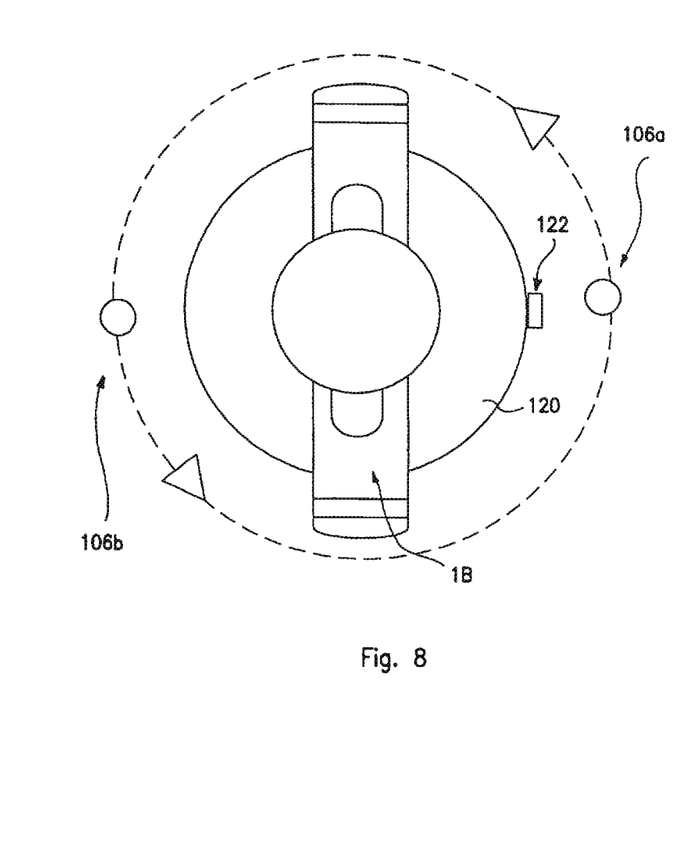
FIGS. 8 and 9 are cross sectional views identical to FIGS. 6 and 7 showing the method of the invention applied to the component of FIG. 1B.
Figure 9:
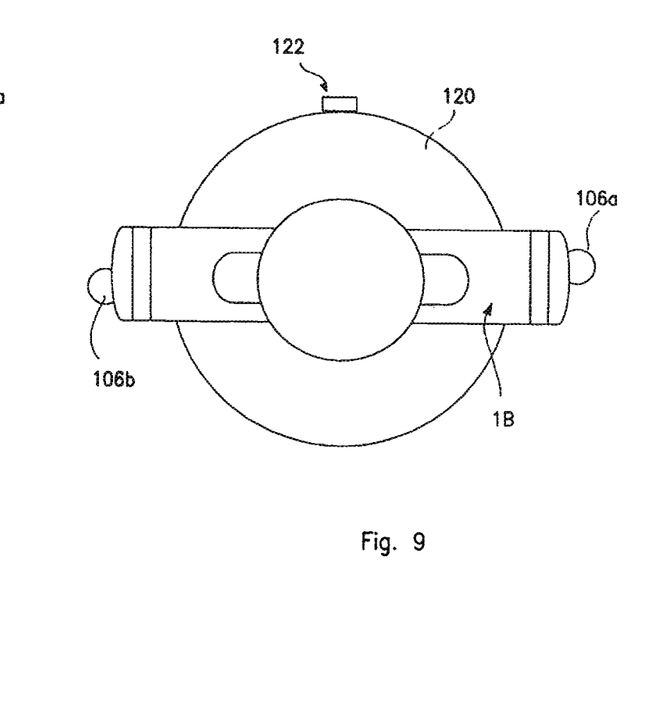
Figure 10:
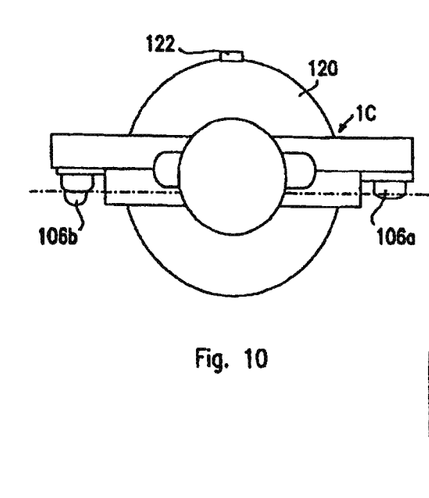
FIG. 10 is a cross sectional view identical to FIG. 7 showing the method of the invention applied to the component of FIG. 1C.
Figure 11:
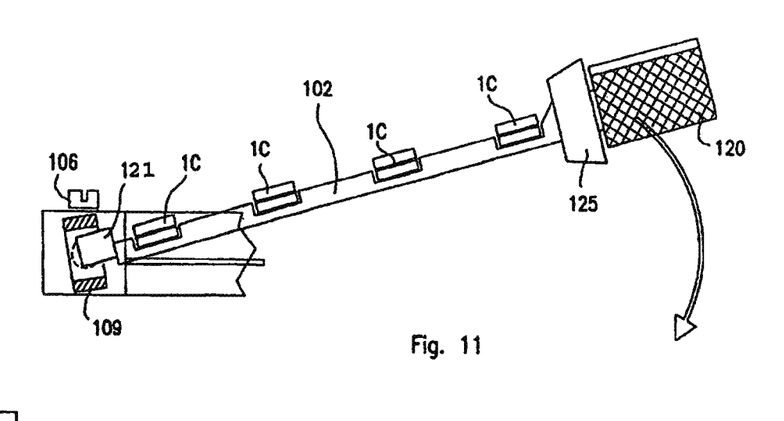
FIGS. 11 and 12 are side views of the device of FIG. 5 when used with the component of FIG. 1C.
Figure 12:
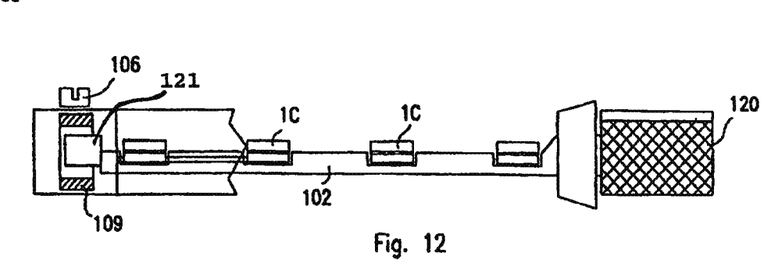

For jigs bearing cells of the 1A or 1B type the jig is first inserted in the frame standing on edge, as shown in the upper part of FIG. 5 or FIG. 6 (cells 1A) or in FIG. 8 (cells 1B) and than rotated by 90° or less, depending on the thickness of the cell, until the electrode pads are brought substantially in contact with the wires 106a,b. (lower part of FIG. 5 and FIG. 7 for cells of the 1A type and FIG. 9 for cells of the 1B type)) Substantially in contact is intended to mean that the wires be spaced apart from the respective pads of a distance comprised between 0 and 200 μm. For cells of the 1C type, the jig is inserted into the frame as shown in FIGS. 11 and 12, first nesting the nose 121 into the sleeve 109 and then pivoting the jig and sleeve so as to lower the knob 120 toward the frame 101. In this way the wires 106A,B are brought into substantial contact with the electrodes 5,6, the contacting conditions being adjustable by means of the vernier 110.

The system is then placed in a heated environment to cure the glue or melt the soldering paste as taught above. This step is generally indicated as "baking".

Mechanical and electrical bonding of the wires to the electrode pads is thereby obtained.

Figure 15:
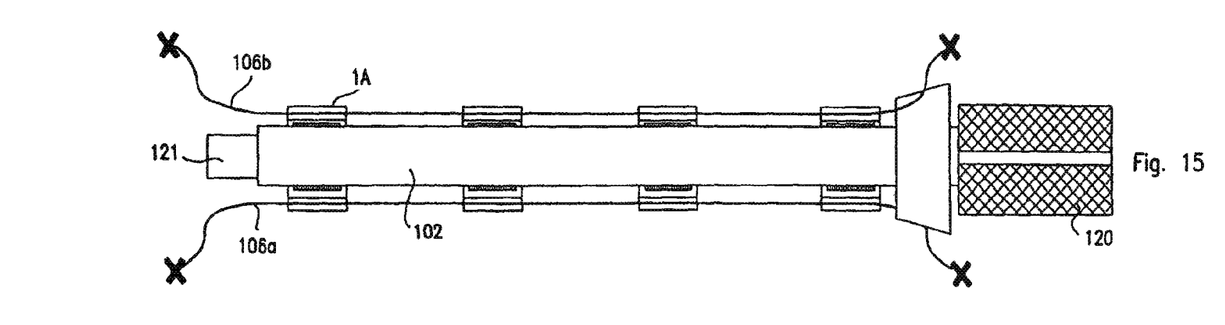
FIGS. 15 to 19 are plan views showing the subsequent phases of the method of this invention.
Figure 16:
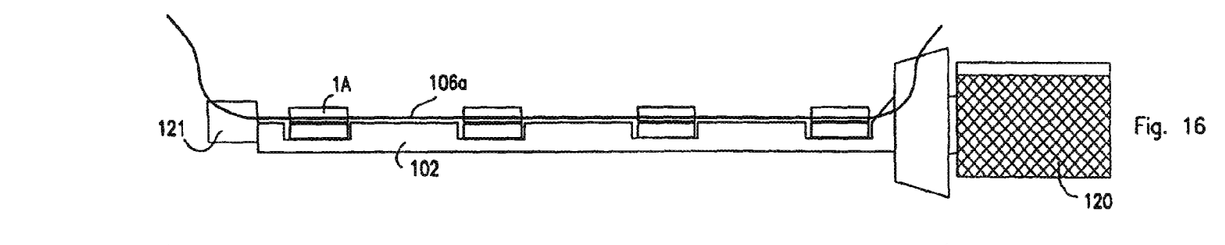
Figure 17:
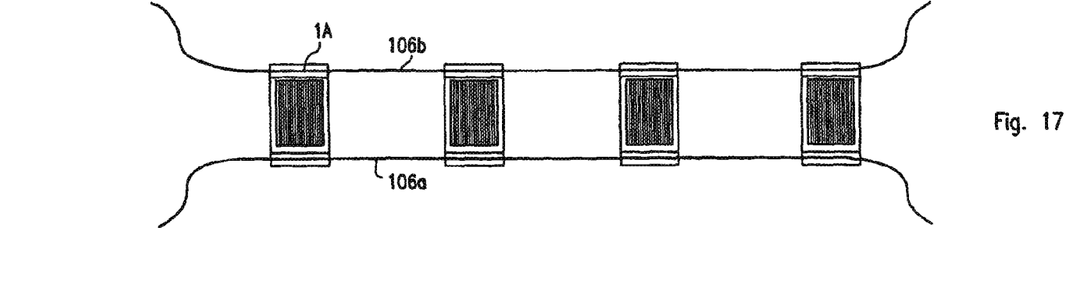

Then the pair of wires are cut close to the respective frame legs (FIG. 15), the jigs are removed from the frame (FIG. 16) and the set of cells attached to each other in parallel, in a sort of chain, are removed from the jigs by closing the suction valve 128. This step is shown in FIG. 17.

Figure 18:
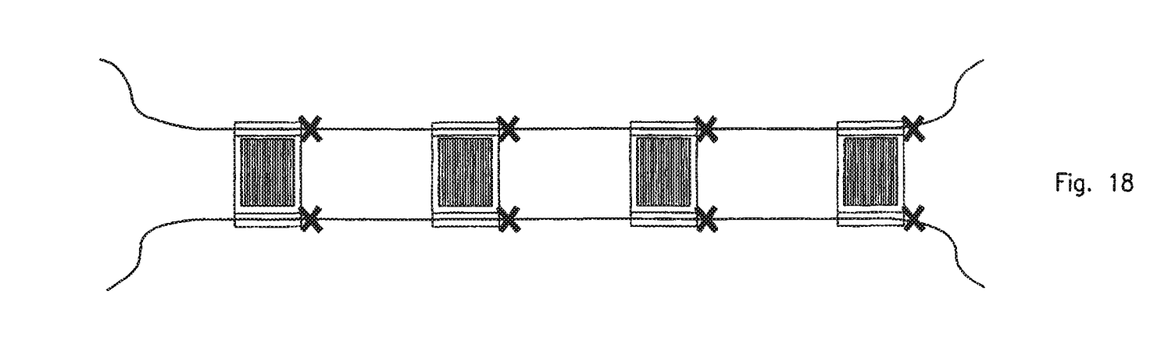

To singularise the wired components, the wires 106a,b are cut close to the same side of each cell, as indicated by a cross in FIG. 18, according to the wiring design needed.

Figure 19:
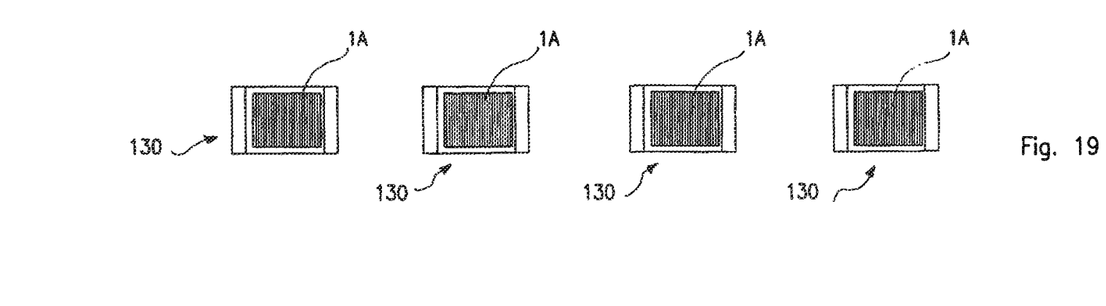

The singularised components 1A,B or C provided with wirings, comprehensively indicated by 130 in FIGS. 13 and 19 are then ready for test and packaging.

The invention claimed is:

1. A method to permanently apply lead terminals to corresponding electrodes of a component, the method comprising:
   inserting a holding jig in a frame, the component seated in a seat of the holding jig, the frame comprising at least two spaced apart frame legs maintaining at least one pair of spaced apart wires in a tensioned state;
   resting a nose at one axial end of the holding jig into a sleeve pivotally mounted on the frame and then pivoting the holding jig and the sleeve so as to lower an opposite axial end of the holding jig toward the frame, thereby bringing the electrodes into substantial contact with the tensioned wires; and
   attaching the pair of wires to the corresponding electrodes.

2. The method of claim 1, further comprising orienting the holding jig relative to the frame so that the tensioned pair of wires on the frame is substantially in contact with the respective electrodes of the component seated in the holding jig.

3. The method of claim 1, further comprising reciprocally disposing the pair of wires and the holding jig so that when one of the tensioned wires is substantially in contact with one of the electrodes, the other one of the tensioned wires is also substantially in contact with the other one of the electrodes.

4. The method of claim 1, further comprising applying an air suction between the seat and the component to removably retain the component within the seat of the holding jig.

5. The method of claim 1, wherein attaching the pair of wires to the corresponding electrodes comprises applying a soldering material to the electrodes and bringing the tensioned wires in contact with the soldering material.

6. The method of claim 5, further comprising bringing the tensioned wires in contact with the soldering material at a distance from the respective electrodes of between 0 microns and about 100 microns.

7. The method of claim 5, further comprising disposing the soldering material over the corresponding electrodes to cover at least 60% of the electrode surface.

8. The method of claim 5, wherein the volume of the soldering material is 1 to 4 times the volume of the section of tensioned wire laying over the surface of the electrode.

9. The method of claim 5, wherein the soldering material comprises a Sn, Pb, Ag, or In based alloy.

10. The method of claim 9, wherein the soldering material comprises a eutectic indium alloy comprising In 97% Ag 3%.

11. The method of claim 5, further comprising baking the soldering material at a baking temperature to permanently attach the tensioned wires to the electrodes.

12. The method of claim 11, wherein the baking temperature is between about 118° and about 280° C.

13. The method of claim 12, further comprising maintaining the baking temperature for a baking time of less than 2 hours when the baking temperature is between about 143° C. and about 280° C.

14. The method of claim 12, further comprising progressively decreasing a baking time from 2 hours to 5 seconds when the baking temperature is increased from about 143° to about 280° C.

15. The method of claim 11, wherein the baking temperature is inversely proportional to the volume of the component.

16. The method of claim 11, wherein the soldering material comprises a soldering paste and baking comprises melting the soldering material.

17. The method of claim 11, wherein for a component volume of less than 50 $mm^3$, the baking temperature and baking time are respectively up to 280° C. and 5 seconds, for a component volume of 50 to 250 $mm^3$, the baking temperature and baking time are respectively up to 180° C. and 5 minutes, while for a component volume of 250 to 1000 $mm^3$, the baking temperature and baking time are respectively up to 150° C. and 60 minutes.

18. The method of claim 11, further comprising baking the soldering material at a baking temperature of 25° to 180° C. and a baking time of 1 minute to 24 hours.

19. The method of claim 1, wherein the electrodes comprise a Cu, Ti pad.

20. The method of claim 1, further comprising coating the electrodes with coatings chosen from Pd, Ni, and Au.

21. The method of claim 1, wherein the tensioned wires comprise Cu, Fe—Ni, or Zn and corresponding alloys.

22. The method of claim 1, further comprising inserting the holding jig in the frame standing on edge and then rotating the holding jig relative to the frame until the electrodes are brought substantially in contact with the tensioned wires.

* * * * *